(12) United States Patent
Hayakawa

(10) Patent No.: US 6,874,951 B2
(45) Date of Patent: Apr. 5, 2005

(54) TRANSMISSION APPARATUS USING A PLASTIC FIBER

(75) Inventor: Toshiro Hayakawa, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/454,601

(22) Filed: Jun. 5, 2003

(65) Prior Publication Data
US 2003/0228113 A1 Dec. 11, 2003

(30) Foreign Application Priority Data
Jun. 5, 2002 (JP) ........................ 2002-164038

(51) Int. Cl.⁷ ................................ G02B 6/36
(52) U.S. Cl. .......................... 385/88; 385/14
(58) Field of Search .................. 385/14, 52, 88, 385/125, 49, 89, 91; 362/496

(56) References Cited

U.S. PATENT DOCUMENTS

| | | | | |
|---|---|---|---|---|
| 6,152,588 A | * | 11/2000 | Scifres | 362/496 |
| 6,244,754 B1 | * | 6/2001 | Takagi et al. | 385/88 |
| 6,385,380 B1 | * | 5/2002 | Friedrich et al. | 385/125 |
| 6,678,432 B2 | * | 1/2004 | Shigeta et al. | 385/14 |
| 2002/0118924 A1 | * | 8/2002 | Murata | 385/52 |

OTHER PUBLICATIONS

Ishigure, T. et al., "2.5 Gbit/s 100 m data transmission using graded-index polymer optical fibre and high-speed laser diode at 650 nm wavelength", Electronics Letters, IEE Stevenage, GB, vol. 31, no. 6, Mar. 16, 1995, pp. 467–469, XP006002565.

Knowles, G. et al., "Influence of leakage and gain-cavity alignment on the performance of Al(GaInP) visible vertical-cavity surface emitting lasers" IEE Proceedings: Optoelectronics, Institution of Electrical Engineers, Stevenage, GB, vol. 148, no. 1, Feb. 16, 2001, pp. 55–59, XP006016130.

Dutta, A. K. et al., "Impedance, modulation response and equivalent-circuit of 650nm surface emitting type light-emitting diode for POF data-links", Solid State Electronics, Elsevier Science Publishers, Barking, GB, vol. 42, no. 10, Oct. 1, 1998, pp. 1787–1791, XP004145291.

* cited by examiner

Primary Examiner—Chau N. Nguyen
(74) Attorney, Agent, or Firm—Sughrue Mion, PLLC

(57) ABSTRACT

Light, which has been produced by a semiconductor device and has wavelengths falling within the range of 630 nm to 680 nm, is propagated through a plastic fiber provided with a core containing a polymethyl methacrylate as a principal constituent. The temperature of the semiconductor device is adjusted by a temperature adjusting system comprising a heater for heating the semiconductor device, a temperature detector for detecting the temperature of the semiconductor device and feeding out a temperature detection signal, and a control circuit for controlling actuation of the heater in accordance with the temperature detection signal in order to set the temperature of the semiconductor device at a predetermined target value that is lower than the highest temperature assumed to occur under an environment, in which the semiconductor device is located.

19 Claims, 10 Drawing Sheets

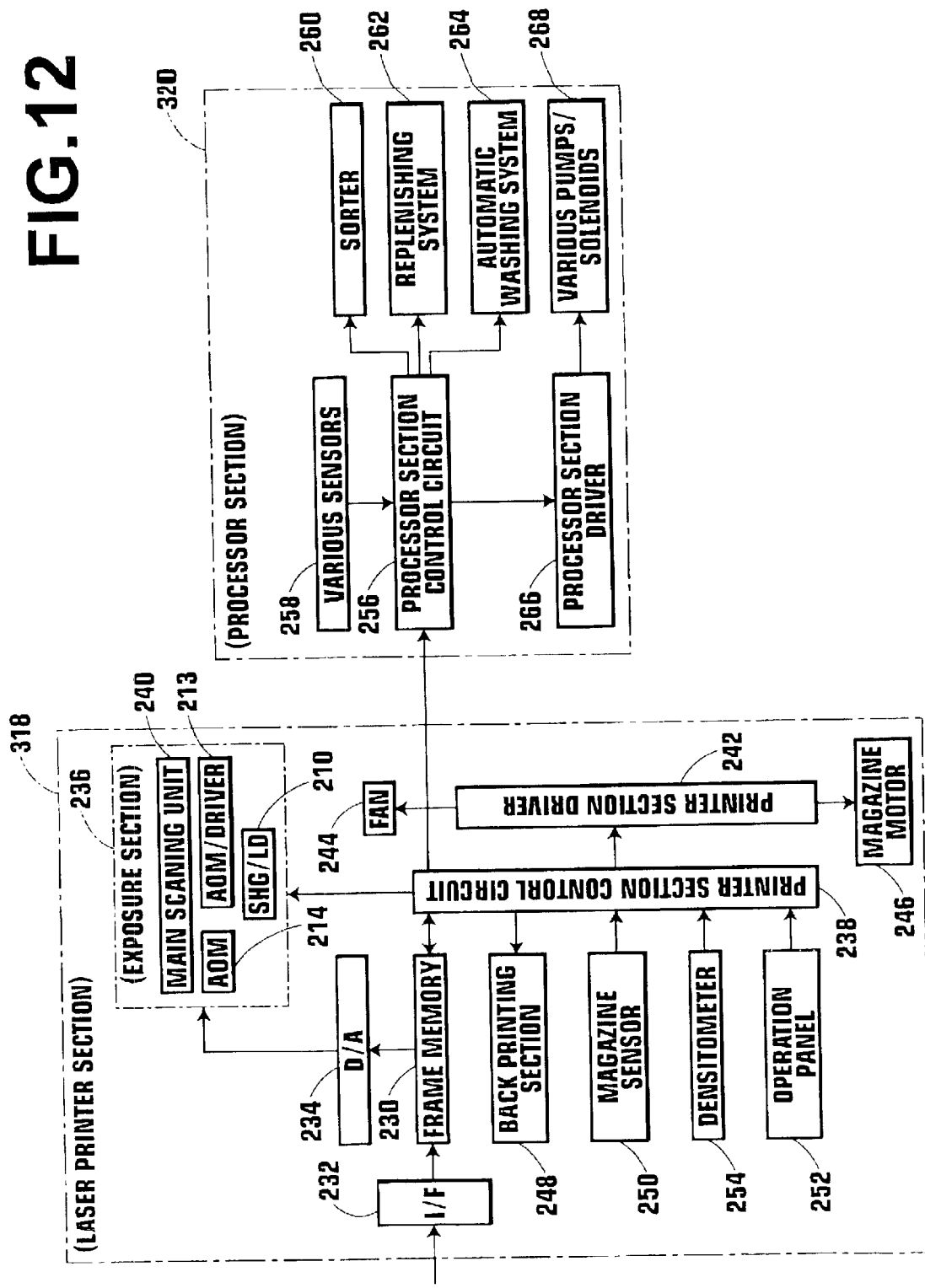

TRANSMISSION APPARATUS USING A PLASTIC FIBER

BACKGROUND OF THE INVENTION

1. Field of the Invention

This invention relates to a transmission apparatus, which utilizes a plastic fiber, for use in an optical communication system, and the like.

2. Description of the Related Art

Ordinarily, as light propagation paths in optical communication, single mode fibers or multi-mode fibers containing quartz glass as a principal material are utilized. The single mode fibers or the multi-mode fibers containing quartz glass as a principal material have a diameter of at most 200 μm. In alignment processes for the fibers, a high position matching accuracy on the order of micron is required. Therefore, fiber laying operations under ordinary environmental conditions, such as conditions at construction work sites, are not easy to perform. The difficulty of the fiber laying operations obstructs further popularization of the fibers described above.

Recently, plastic fibers, which have a comparatively large diameter and are comparatively easy to lay, have been proposed. However, for reasons of production processes, the plastic fibers primarily have a step index type of structure. The step index types of plastic fibers cannot transmit a signal of a high bit rate over a long distance. Specifically, in cases where a pulsed light signal is inputted into an entry end face of the step index type of fiber, a phenomenon is encountered in that a wave form of the pulsed light signal becomes deformed and spreads at a radiating end face of the fiber after being propagated over a long distance through the fiber. Therefore, in cases where a successively pulsed light signal is transmitted through the step index type of fiber, the problems occur in that the pulses, which are adjacent to each other on the time axis, overlap one upon the other, and a perfectly extinct state cannot be obtained with respect to a logic "0" level of the signal at the radiating end face of the fiber. In other words, in cases where the pulsed light signal of a short pulse width is transmitted through the fiber, a logic "0" level and a logic "1" level of the signal cannot easily be discriminated from each other after the signal has been transmitted through the fiber. Accordingly, the step index types of plastic fibers are not appropriate for large capacities of optical communication. The problems described above are described in, for example, "Fundamentals and Practice of Plastic Optical Fibers" by Yasuhiro Koike, supervised by Seizo Miyata, NTS K. K., pp. 84–87, 2000.

In order for the aforesaid problems to be eliminated, a graded index type of fiber, which has a comparatively large diameter and is free from an increase in pulse width of a pulsed light signal after being transmitted, has been proposed and is expected to be used in practice. However, it has been found that the problems described below are encountered with this type of fiber.

Specifically, a plastic fiber using a fluoride (e.g., Lucina, supplied by Asahi Glass Co., Ltd.) has been used in practice. However, the fluoride raw material is expensive, and therefore the cost of the fiber cannot be kept low. Also, in cases where the core diameter of the fiber is set at a large value, since the amount of the fluoride becomes large, the cost becomes high. Therefore, with the plastic fiber using a fluoride, it is not possible to utilize the advantages of the plastic fiber in that the cost is capable of being kept low, and in that the fiber laying operations are easy to perform by virtue of a large-diameter core.

As a core material, which is available at a low cost and is capable of easily forming a large-diameter core, a polymethyl methacrylate (PMMA) has heretofore been known. It may be considered that a graded index type of optical fiber is produced by the utilization of the PMMA as a principal core material. However, as illustrated in FIG. 6, the fiber provided with the core, which contains the PMMA as a principal constituent, has the characteristics such that the wavelength regions associated with a low propagation loss occur only at limited wavelength regions (in the vicinities of 520 nm, 570 nm, and 650 nm) falling within the visible region. (FIG. 6 is cited from a literature "POF-polymer optical fibers for data communication," Springer-Verlag, 2002.)

Of the aforesaid limited wavelength regions associated with a low propagation loss, a wavelength region of light, which a semiconductor laser or a light emitting diode (LED) allowing quick modulation is capable of producing, is currently only the region in the vicinity of 650 nm. As for the production of light having wavelengths falling within a wavelength region shorter than 650 nm, research has heretofore been conducted to develop a laser utilizing a II-VI Group compound semiconductor. However, a laser utilizing a II-VI Group compound semiconductor, which laser is capable of producing light having wavelengths falling within the wavelength region shorter than 650 nm and has practically acceptable reliability, has not yet been obtained.

Of the wavelength region in the vicinity of 650 nm, which wavelength region is associated with a low propagation loss, the propagation loss characteristics with respect to a wavelength region of 630 nm to 680 nm are such that the propagation loss is as low as approximately at most 300 dB/km. In particular, the propagation loss characteristics with respect to a narrow wavelength region of 640 nm to 660 nm are such that the propagation loss is as low as approximately at most 200 dB/km. In cases where light having wavelengths outside the aforesaid narrow wavelength region, e.g. wavelengths slightly longer than 660 nm, is to be propagated, the propagation loss varies markedly in accordance with the wavelengths. Therefore, in such cases, if the wavelengths of the light produced by a light source alter, the characteristics of the transmission apparatus will vary. It may be possible that the transmission characteristics exhibiting large variance be improved by the utilization of a new material for the fiber core. However, in such cases, the cost of the fiber will become higher than the cost of the fiber utilizing the ordinary PMMA.

As a light source capable of producing light having wavelengths in the vicinity of 650 nm, which light source is capable of producing the light having an intensity of approximately 1 mW necessary for optical communication and allows quick modulation ranging from 400 MHz to at least 1 GHz, an end face emission type of semiconductor laser, which is currently utilized for DVD's, and the like, is most excellent for high stability of laser beam production at high temperatures and for high reliability. However, in cases where the end face emission type of the semiconductor laser is utilized for optical transmission in combination with the plastic fiber, the problems of the Fabry-Pérot resonator types of lasers occur in that the wavelength of the produced laser beam shifts in accordance with temperatures. The problems described above occur due to the characteristics of the semiconductor such that the energy gap of the semiconductor is dependent upon temperature. The shift of the wavelength of the produced laser beam is represented by the formula shown below.

$$\frac{\Delta \lambda_0}{\Delta T_j} = -\frac{1.24}{E_g^2} \cdot \frac{dE_g}{dT_j}$$

wherein $\lambda_o$ represents the wavelength of the produced laser beam, $T_j$ represents the bonding temperature of the semiconductor laser, and $E_g$ represents the energy gap.

In the cases of the 650 nm-band semiconductor laser, the actual dependence of the wavelength upon temperature is in accordance with 0.2 nm/deg. Therefore, in cases where the ambient temperature rises by 100° C., the wavelength of the produced laser beam shifts by approximately 20 nm toward the longer wavelength side. Also, a variation of the absolute wavelength at the time of the production of the semiconductor laser is approximately ±5 nm. Therefore, in cases where the shift described above and the variation described above are summed up, it is necessary for the wavelength fluctuation range of approximately 30 nm to be taken into consideration. However, in such cases, with the plastic fiber having the propagation characteristics illustrated in FIG. 6, since there is the risk of the propagation loss becoming large, the problems occur in that, for example, limitation is imposed upon the length of distance over which the plastic fiber is utilized.

The problems described above may be solved with a technique where in a peltier device, which is employed for optical communication through trunk lines, is utilized to keep the temperature at a predetermined value through heating or cooling. However, with the technique utilizing the Peltier device, the problems occur in that, since the cost of the Peltier device is high, the cost of the transmission apparatus cannot be kept low.

SUMMARY OF THE INVENTION

The primary object of the present invention is to provide a transmission apparatus comprising a combination of a plastic fiber, which is capable of forming a large-diameter core, and a semiconductor light emitting device, which produces light having wavelengths that are dependent upon temperature, the transmission apparatus being constituted such that the cost of the transmission apparatus is capable of being kept comparatively low, and such that stable transmission characteristics with a low propagation loss are capable of being obtained.

Another object of the present invention is to provide a transmission apparatus using a plastic fiber, which transmission apparatus enables quick and large-capacity optical communication to be performed over a markedly long length of distance.

The present invention provides a transmission apparatus using a plastic fiber, comprising:

i) a plastic fiber, which is provided with a core containing a polymethyl methacrylate as a principal constituent, and ii) a semiconductor light emitting device, which produces light to be propagated through the plastic fiber, wherein the semiconductor light emitting device is a device, which produces light having wavelengths falling within the range of 630 nm to 680 nm, and the transmission apparatus further comprises a temperature adjusting system, which comprises:

a) heating means for heating the semiconductor light emitting device, b) temperature detecting means for detecting the temperature of the semiconductor light emitting device and feeding out a temperature detection signal, which represents the temperature of the semiconductor light emitting device, and c) a control circuit for controlling actuation of the heating means in accordance with the temperature detection signal, which is received from the temperature detecting means, in order to set the temperature of the semiconductor light emitting device at a predetermined target value that is lower than the highest temperature assumed to occur under an environment, in which the semiconductor light emitting device is located.

The transmission apparatus using a plastic fiber in accordance with the present invention should preferably be modified such that the semiconductor light emitting device is a device, which produces light having wavelengths falling within the range of 640 nm to 660 nm.

Also, the transmission apparatus using a plastic fiber in accordance with the present invention should preferably be modified such that the semiconductor light emitting device is an end face emission type of semiconductor laser.

Alternatively, the transmission apparatus using a plastic fiber in accordance with the present invention may be modified such that the semiconductor light emitting device is a surface emission type of semiconductor laser or a surface emission type of light emitting diode.

Further, the transmission apparatus using a plastic fiber in accordance with the present invention should preferably be modified such that the plastic fiber is a graded index type of fiber.

With the transmission apparatus using a plastic fiber in accordance with the present invention, the plastic fiber is provided with the core containing the polymethyl methacrylate as a principal constituent. Also, the semiconductor light emitting device is the device producing the light having wavelengths falling within the range of 630 nm to 680 nm, for which range the plastic fiber exhibits the characteristics of a low propagation loss of as low as approximately at most 300 dB/km. Therefore, with the transmission apparatus using a plastic fiber in accordance with the present invention, the propagation loss is capable of being kept low. Particularly, in cases where the transmission apparatus using a plastic fiber in accordance with the present invention is modified such that the semiconductor light emitting device is the device, which produces the light having wavelengths falling within the range of 640 nm to 660 nm, the characteristics of a low propagation loss of as low as approximately at most 200 dB/km are capable of being obtained.

Also, with the transmission apparatus using a plastic fiber in accordance with the present invention, the temperature of the semiconductor light emitting device is set at the predetermined target value by the temperature adjusting system, which comprises the heating means, the temperature detecting means, and the control circuit. Therefore, the fluctuation of the wavelengths of the light produced by the semiconductor light emitting device are capable of being suppressed so as to fall within a narrow range, and the problems are capable of being prevented from occurring in that the wavelengths of the light produced by the semiconductor light emitting device shift from the region, for which region the plastic fiber exhibits the characteristics of a low propagation loss. Accordingly, the stable transmission characteristics with a low propagation loss are capable of being obtained. As a result, with the transmission apparatus using a plastic fiber in accordance with the present invention, quick and large-capacity optical communication is capable of being performed over a markedly long length of distance.

Further, the temperature adjusting system does not utilize a high-cost device having cooling effects, such as the Peltier device, and sets the temperature of the semiconductor light emitting device at the predetermined target value by use of the heating means. Therefore, with the transmission apparatus using a plastic fiber in accordance with the present invention, the cost of the transmission apparatus is capable of being kept comparatively low, and the stable transmission characteristics are capable of being obtained.

Furthermore, the temperature adjusting system operates to set the temperature of the semiconductor light emitting device at the predetermined target value that is lower than the highest temperature assumed to occur under the environment, in which the semiconductor light emitting device is located. Therefore, the temperature adjusting system is capable of being kept simpler than in cases where the temperature of the semiconductor light emitting device is set by use of the heating means at the highest temperature assumed to occur under the environment, in which the semiconductor light emitting device is located, or at a target value that is higher than the assumed highest temperature. Accordingly, the effect of keeping the cost of the transmission apparatus low is capable of being enhanced markedly. Also, the problems are capable of being prevented from occurring in that the light source deteriorates due to high temperatures, and in that the reliability of module parts become slow due to high temperatures.

With the transmission apparatus using a plastic fiber in accordance with the present invention, the target value of the temperature adjustment is set at the value described above. Therefore, in cases where the ambient temperature rises markedly, it may occur that the temperature adjustment is not performed for the semiconductor light emitting device. However, in such cases, since the semiconductor light emitting device, which produces the light having wavelengths limited to fall within the aforesaid wavelength range, is employed, the advantages are capable of being obtained in that the practically satisfactory characteristics of a low propagation loss are capable of being obtained. The advantages described above will be described later in detail.

BRIEF DESCRIPTION OF THE DRAWINGS

FIG. 12 is a block diagram showing electric systems of a laser printer section and a processor section of the digital laboratory system.

DESCRIPTION OF THE PREFERRED EMBODIMENTS

The present invention will hereinbelow be described in further detail with reference to the accompanying drawings.

Figure 1:
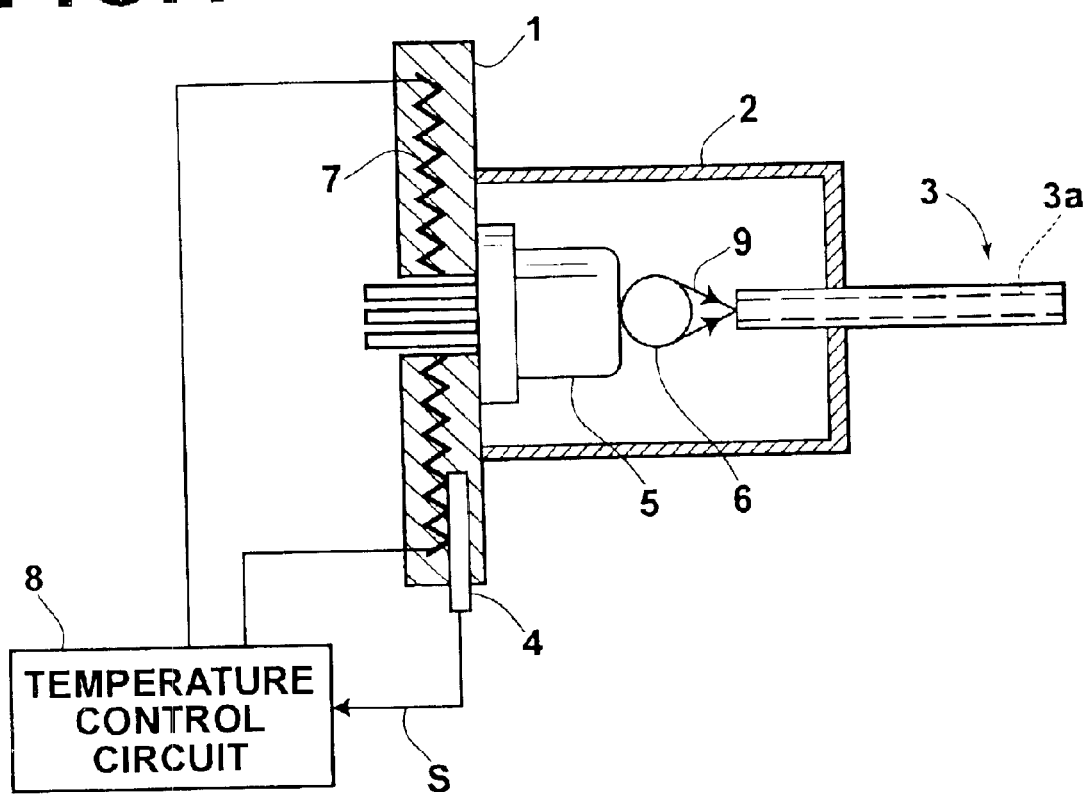
FIG. 1 is a partially cutaway side view showing a first embodiment of the transmission apparatus using a plastic fiber in accordance with the present invention.

FIG. 1 is a partially cutaway side view showing a first embodiment of the transmission apparatus using a plastic fiber in accordance with the present invention. The section illustrated in FIG. 1 constitutes a light sending module section. As illustrated in FIG. 1, the transmission apparatus comprises abase plate 1. The transmission apparatus also comprises a can type package 2, which is secured to the base plate 1. The transmission apparatus further comprises a plastic fiber 3, whose one end is inserted into the can type package 2. The transmission apparatus still further comprises a thermistor 4, which is located within a hole made through the base plate 1. The transmission apparatus also comprises an end face emission type of semiconductor laser 5, which is accommodated within the can type package 2 and has a stem fitted to the base plate 1. The transmission apparatus further comprises a ball lens 6, which is accommodated within the can type package 2. An electric heater 7 is built in the base plate 1. A temperature control circuit 8 actuates the electric heater 7 in accordance with an output signal of the thermistor 4.

The semiconductor laser 5 has the characteristics such that the wavelength of a laser beam produced at a temperature of 25° C. and an output power of 3 mW is 648 nm, and such that the dependence of the wavelength of the produced laser beam upon temperature is approximately 0.2 nm/deg. The semiconductor laser 5 is accommodated within the can type package 2 having a diameter of 5.6 mm. The plastic fiber 3 has a core 3a constituted of a PMMA. The diameter of the core 3a is 700 μm, and the diameter of the plastic fiber 3, including a cladding layer, is 900 μm. A laser beam 9, which has been produced by the semiconductor laser 5, is converged by the ball lens 6 onto an end face of the core 3a of the plastic fiber 3 and enters into the core 3a. The laser beam 9 is guided in a multi-mode and propagated through the core 3a.

The electric heater 7 acting as heating means, the thermistor 4 acting as temperature detecting means, and the temperature control circuit 8 together constitute a temperature adjusting system. The temperature of the semiconductor laser 5 is set at a predetermined target value by the temperature adjusting system. Specifically, the temperature control circuit 8 controls an actuating current for the electric heater 7 in accordance with a temperature detection signal S, which is received from the thermistor 4. In this manner, the temperature of the base plate 1 and, consequently, the temperature of the semiconductor laser 5 are kept at the predetermined target value.

The target value of the temperature adjustment is set at a value that is lower than the highest temperature assumed to occur under the environment, in which the semiconductor laser 5 is used. In this embodiment, it is assumed that the ambient temperature takes a value falling within the range of, for example, −45° C. to +85° C., and the target value of the temperature adjustment is set at +35° C.

The electric heater 7 has the functions for heating the semiconductor laser 5, and the temperature adjusting system is not provided with cooling means. The temperature adjusting system thus has the simple constitution. Also, the temperature adjustment conditions are set in the manner described above. Therefore, in cases where the ambient temperature takes a value falling within the range of −45° C. to +35° C., the temperature of the semiconductor laser 5 is capable of being adjusted at +35° C. However, in cases where the ambient temperature takes a value falling within the range of +35° C. to +85° C., the temperature of the semiconductor laser 5 fluctuates in accordance with the ambient temperature.

In the cases described above, if the temperature adjustment is not performed, the temperature of the semiconductor laser 5 will fluctuate over the range of 130° C. However, in this embodiment, since the temperature adjustment is performed, the range over which the temperature alters is capable of being suppressed markedly to 50° C. Therefore, the range over which the wavelength of the laser beam produced by the semiconductor laser 5 fluctuates is capable of being suppressed to approximately 10 nm. (If the temperature adjustment is not performed, the range over which the wavelength of the laser beam produced by the semiconductor laser 5 fluctuates will be as broad as approximately 26 nm.) Specifically, in cases where the ambient temperature takes a value falling within the range of −45° C. to +35° C., the wavelength of the produced laser beam is kept at approximately 650 nm. In cases where the ambient temperature takes a value falling within the range of +35° C. to +85° C., the wavelength of the produced laser beam fluctuates within the range of approximately 650 nm to approximately 660 nm.

Figure 6:
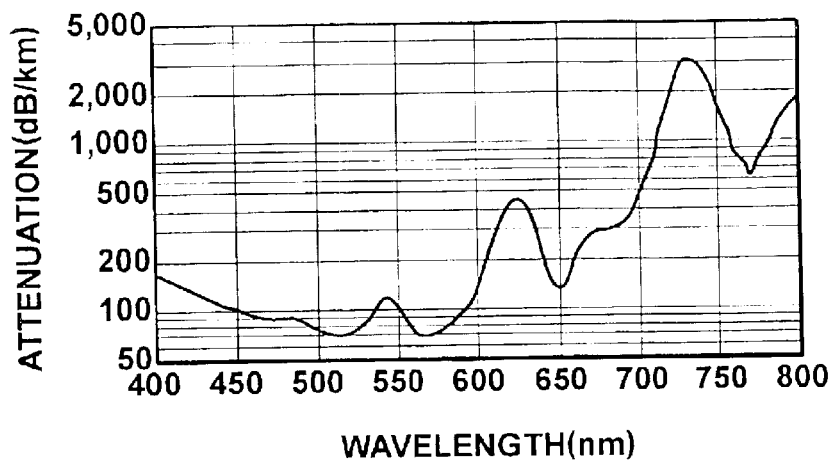
FIG. 6 is a graph showing propagation loss characteristics of a PMMA plastic fiber employed in the transmission apparatus using a plastic fiber in accordance with the present invention.

In the manner described above, the range over which the wavelength of the laser beam 9 fluctuates is suppressed to an arrow range. Therefore, the wavelength region, for which the PMMA plastic fiber exhibits the transmission characteristics with a low propagation loss as illustrated in FIG. 6, is capable of being utilized efficiently, and the stable transmission characteristics with a low propagation loss are capable of being obtained. Accordingly, with this embodiment of the transmission apparatus in accordance with the present invention, quick and large-capacity optical communication is capable of being performed over a markedly long length of distance.

Also, as described above, the temperature adjusting system is constituted such that the temperature adjusting system adjusts the temperature of the semiconductor laser 5 at the predetermined target value in cases where the ambient temperature takes a value falling within the range of −45° C. to +35° C., and such that the temperature adjusting system does not perform the adjustment of the temperature of the semiconductor laser 5 in cases where the ambient temperature takes a value falling within the range of +35° C. to +85° C. Therefore, the cost of the temperature adjusting system is capable of being kept comparatively low. Accordingly, with this embodiment of the transmission apparatus in accordance with the present invention, the problems are capable of being prevented from occurring in that the cost of the transmission apparatus becomes markedly high for the system for the temperature adjustment.

With the end face emission type of the semiconductor laser 5, a high output power of at least 3 mW is capable of being obtained easily, and the output power is capable of being enhanced even further. Therefore, the end face emission type of the semiconductor laser 5 has the advantage in that the transmission loss, including the loss at various coupling sections of the fiber optical system, is capable of being compensated for by the enhancement of the output power of the semiconductor laser 5. The end face emission type of the semiconductor laser 5 also has the advantage in that the operation stability at high temperatures is good, and therefore the semiconductor laser 5 is capable of operating reliably in cases where the operating temperature becomes comparatively high due to the temperature adjustment with the heating. By virtue of the two advantages described above, the end face emission type of the semiconductor laser 5 is employed particularly appropriately in the transmission apparatus in accordance with the present invention.

For example, in cases where the semiconductor laser is produced such that the wavelength of the produced laser beam falls within the range of 645±5 nm (at 35° C.), and the operating temperature is limited to the range of 35° C. to 85° C. as in the embodiment described above, the wavelength of the produced laser beam is capable of being limited to the range of 640 nm to 660 nm with the device variation and the change in device temperature being taken into consideration. Therefore, in cases where the PMMA plastic fiber having the propagation loss characteristics as illustrated in FIG. 6 is employed, the wavelength region associated with the low propagation loss of at most approximately 200 dB/km is capable of being utilized efficiently. Specifically, the quick long-distance transmission of 1 GHz·100 m is capable of being performed by use of the graded index type of the PMMA plastic fiber.

In the embodiment described above, the ball lens 6 is utilized in order to converge the laser beam 9. Alternatively, a lens other than the ball lens may be utilized in order to converge the laser beam 9. Also, the converging lens may be fitted to a window of the can type package 2. Further, the diameter of the core 3a of the plastic fiber 3 is not limited to 700 $\mu$m and may take a value of, for example, 900 $\mu$m. With the plastic fiber employed in the transmission apparatus in accordance with the present invention, since the core diameter is capable of being set at a large value, the end of the plastic fiber may be located close to the semiconductor light emitting device, and the laser beam is thus capable of being directly coupled with the plastic fiber without a lens being utilized.

Furthermore, in cases where the target value of the temperature adjustment is set at a value higher than normal temperatures, the effect of preventing moisture condensation on optical elements is capable of being obtained.

Also, in the embodiment described above, the end face emission type of the semiconductor laser is employed. Alternatively, in the transmission apparatus in accordance with the present invention, a surface emission type of semiconductor laser may be employed. With the surface emission type of the semiconductor laser, by virtue of the effect of a distributed Bragg reflector (DBR) mirror, the dependence of the wavelength of the produced laser beam upon temperature is ordinarily as low as approximately one-third of the dependence of the wavelength of the laser beam, which is produced by the end face emission type of the semiconductor laser, upon temperature. Therefore, with the surface emission type of the semiconductor laser, in cases where the temperature adjustment is not performed, the wavelength of the produced laser beam is capable of being limited to the same range as that in the embodiment described above. However, such that the wavelength region, for which the PMMA plastic fiber exhibits the transmission characteristics with a low propagation loss as illustrated in FIG. 6, may be utilized efficiently, the temperature of the surface emission type of the semiconductor laser should preferably be adjusted at a value falling within a narrow range. From the view point described above, it is also preferable that the surface emission type of semiconductor laser be employed in the transmission apparatus in accordance with the present invention. Further, in the transmission apparatus in accordance with the present invention, it is also possible to employ a resonant cavity LED (RC-LED), which is the LED utilizing the DBR mirror.

Figure 2:
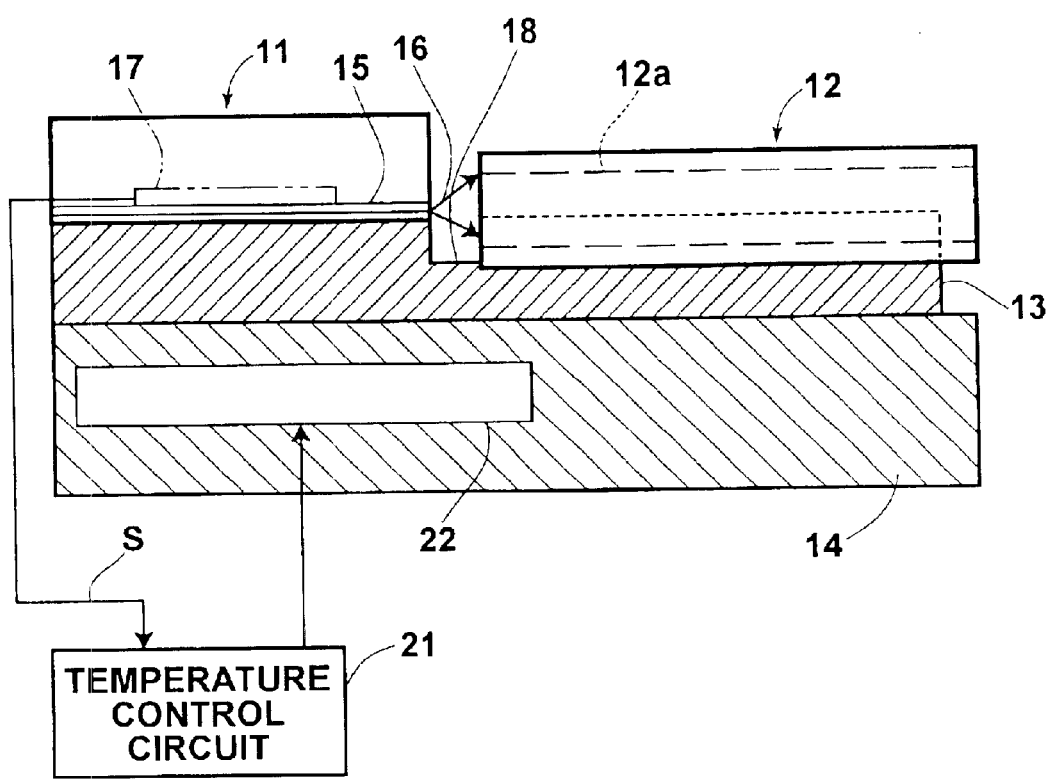
FIG. 2 is a side view showing a second embodiment of the transmission apparatus using a plastic fiber in accordance with the present invention.
Figure 3:
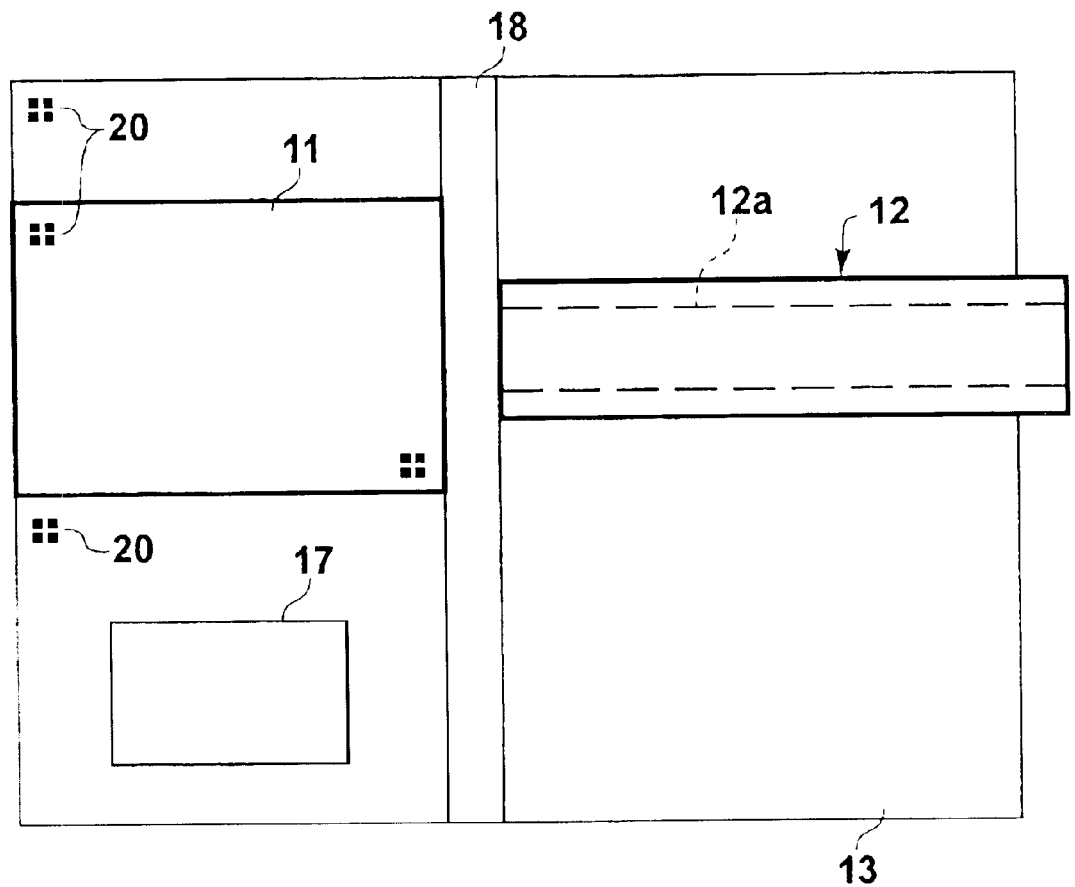
FIG. 3 is a plan view showing part of the transmission apparatus of FIG. 2.
Figure 4:
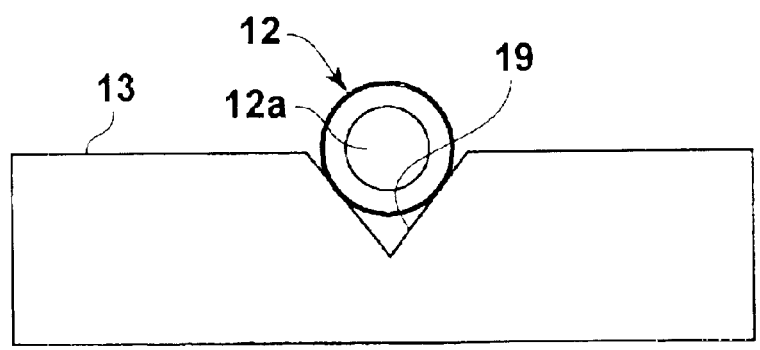
FIG. 4 is a front view showing part of the transmission apparatus of FIG. 2.

A second embodiment of the transmission apparatus using a plastic fiber in accordance with the present invention will be described hereinbelow. FIG. 2 is a side view showing a second embodiment of the transmission apparatus using a plastic fiber in accordance with the present invention. FIG. 3 is a plan view showing part of the transmission apparatus of FIG. 2, which part is located above a submount of the transmission apparatus. FIG. 4 is a front view showing part of the transmission apparatus of FIG. 2, which part is located above a submount of the transmission apparatus. The second embodiment of the transmission apparatus using a plastic fiber in accordance with the present invention constitutes a sending submodule 10, which is employed in a sending-receiving module 30 illustrated in FIG. 5 as will be described later. As illustrated in FIG. 2, the sending submodule 10 comprises a semiconductor laser chip 11, which is of the end face emission type. The sending submodule 10 also comprises a PMMA plastic fiber 12. The sending submodule 10 further comprises a submount 13, which is made from Si and secures the semiconductor laser chip 11 and the PMMA plastic fiber 12. The sending submodule 10 still further comprises a base plate 14, which secures the Si submount 13 and acts as a heat dissipating plate.

The semiconductor laser chip 11 has the characteristics such that the wavelength of a laser beam produced at a temperature of 25° C. and an output power of 3 mW is 650 nm, and such that the dependence of the wavelength of the produced laser beam upon temperature is approximately 0.2 nm/deg. A bonding surface of the semiconductor laser chip 11, i.e. the surface located on the side close to an active layer 15, is secured with soldering to the top surface of the Si submount 13. The PMMA plastic fiber 12 has a core 12a. The diameter of the core 12a is 500 μm, and the diameter of the PMMA plastic fiber 12, including a cladding layer, is 700 μm. The PMMA plastic fiber 12 is located such that a laser beam 16, which has been produced by the semiconductor laser chip 11, impinges directly upon the end face of the core 12a of the PMMA plastic fiber 12. The laser beam 16 thus enters into the core 12a. The laser beam 16 is guided in the multi-mode and propagated through the core 12a.

A thermistor 17 acting as the temperature detecting means is secured to the top surface of the Si submount 13. The thermistor 17 is located at a position close to the semiconductor laser chip 11. Also, a separating groove 18 for separating the semiconductor laser chip 11 and the PMMA plastic fiber 12 from each other is formed in the top surface of the Si submount 13. Further, a groove 19, which has a V-shaped cross-section and acts to adjust the position of the PMMA plastic fiber 12, is formed in the top surface of the Si submount 13. The position of the PMMA plastic fiber 12 is regulated by the V-shaped groove 19, and the PMMA plastic fiber 12 is thereafter secured to the Si submount 13 by use of a UV-curing type of adhesive agent.

The divergence angle of the laser beam 16, which is radiated out from the semiconductor laser chip 11, is approximately 30 degrees, expressed in terms of the full width at half maximum. In cases where the width of the separating groove 18 is set at a value falling within the range of approximately 50 μm to approximately 100 μm, a lens need not be utilized, and the laser beam 16 is capable of being coupled with the PMMA plastic fiber 12 with an efficiency of at least 70%. Also, in cases where the semiconductor laser chip 11 and the Si submount 13 are provided with alignment marks 20, 20, . . . , the position of the V-shaped groove 19, which acts to regulate the position of the PMMA plastic fiber 12, and the emitting position of the semiconductor laser chip 11 are capable of being matched with each other. Therefore, in such cases, accurate alignment is capable of being achieved with a simple assembly operation.

In the second embodiment, as in the first embodiment described above, an electric heater 22, which is built in the base plate 14 and acts as the heating means, the thermistor 17 acting as the temperature detecting means, and a temperature control circuit 21 together constitute the temperature adjusting system. The temperature of the semiconductor laser chip 11 is set at a predetermined target value by the temperature adjusting system. Specifically, the temperature control circuit 21 controls the actuating current for the electric heater 22 in accordance with the temperature detection signal S, which is received from the thermistor 17. In this manner, the temperature of the base plate 14 and, consequently, the temperature of the semiconductor laser chip 11 are kept at the predetermined target value.

The target value of the temperature adjustment is set at a value that is lower than the highest temperature assumed to occur under the environment, in which the semiconductor laser chip 11 is used. In the second embodiment, as in the first embodiment described above, it is assumed that the ambient temperature takes a value falling within the range of, for example, −45° C. to +85° C., and the target value of the temperature adjustment is set at +35° C. The temperature adjustment conditions are set in the manner described above. Therefore, in cases where the ambient temperature takes a value falling within the range of −45° C. to +35° C., the temperature of the semiconductor laser chip 11 is capable of being adjusted at +35° C. However, in cases where the ambient temperature takes a value falling within the range of +35° C. to +85° C., the temperature of the semiconductor laser chip 11 fluctuates in accordance with the ambient temperature.

In the cases described above, if the temperature adjustment is not performed, the temperature of the semiconductor laser chip 11 will fluctuate over the range of 130° C. However, in the second embodiment, since the temperature adjustment is performed, the range over which the temperature alters is capable of being suppressed markedly to 50° C. Therefore, the range over which the wavelength of the laser beam produced by the semiconductor laser chip 11 fluctuates is capable of being suppressed to approximately 10 nm. (If the temperature adjustment is not performed, the range over which the wavelength of the laser beam produced by the semiconductor laser chip 11 fluctuates will be as broad as approximately 26 nm.) Specifically, in cases where the ambient temperature takes a value falling within the range of −45° C. to +35° C., the wavelength of the produced laser beam is kept at approximately 652 nm. In cases where the ambient temperature takes a value falling within the range of +35° C. to +85° C., the wavelength of the produced laser beam fluctuates within the range of approximately 652 nm to approximately 662 nm.

In the manner described above, the range over which the wavelength of the laser beam 16 fluctuates is suppressed to a narrow range. Therefore, the wavelength region, for which the PMMA plastic fiber exhibits the transmission characteristics with a low propagation loss as illustrated in FIG. 6, is capable of being utilized efficiently, and the stable transmission characteristics with a low propagation loss are capable of being obtained. Accordingly, with this embodiment of the transmission apparatus in accordance with the present invention, quick and large-capacity optical communication is capable of being performed over a markedly long length of distance.

In the second embodiment, the heating of the semiconductor laser chip 11 is performed by the electric heater 22, which is separate from the semiconductor laser chip 11. Alternatively, a heater may be located on the semiconductor laser chip 11. In such cases, the heating of the semiconductor laser chip 11 is capable of being performed more efficiently. Also, in cases where the heating of the semiconductor laser chip 11 is performed by a heater, which is separate from the semiconductor laser chip 11, in lieu of the heater being built in the base plate 14, the heater may be located, for example, on the Si submount 13.

Figure 5:
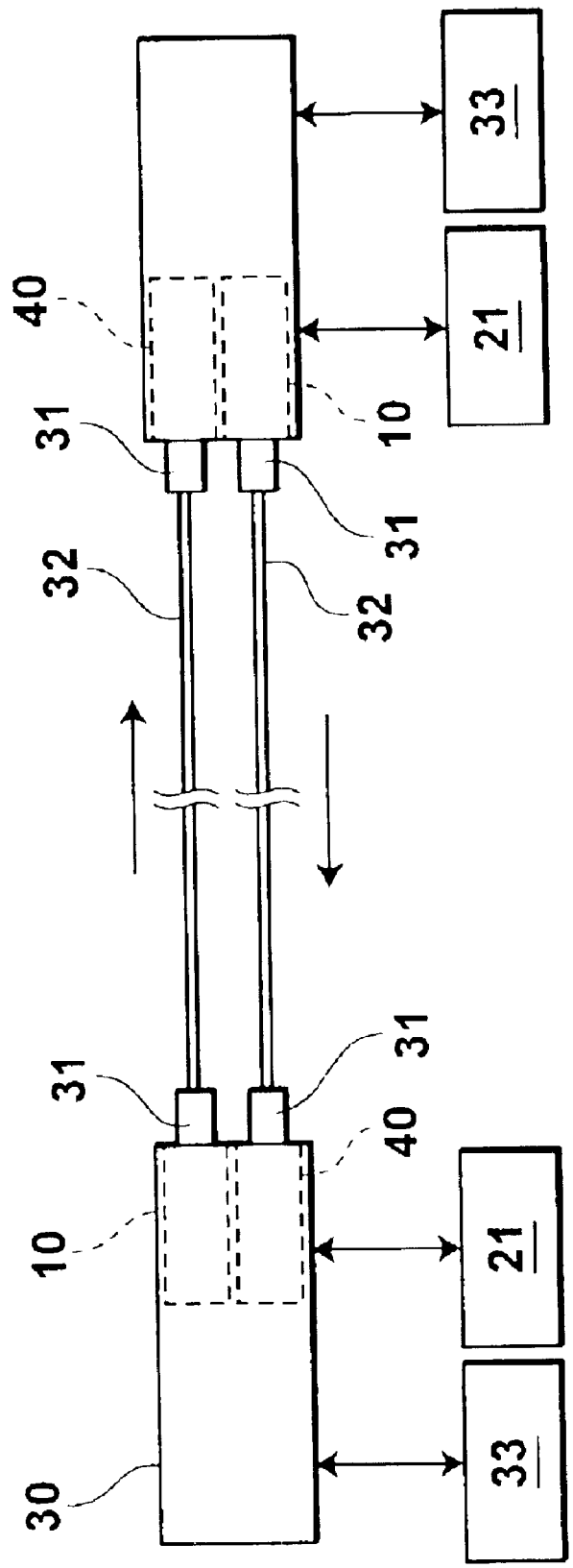
FIG. 5 is a schematic view showing a bidirectional optical communication system, in which the transmission apparatus of FIG. 2 is employed.

As illustrated in FIG. 5, in an example of a bidirectional optical communication system, the sending submodule 10 described above is located within the sending-receiving module 30. The PMMA plastic fiber 12 (not shown in FIG. 5) of the sending submodule 10 is connected by a connector 31 to a transmitting PMMA plastic fiber 32. Also, the temperature control circuit 21 described above and a sending-receiving circuit 33 are connected to the sending-receiving module 30.

In this example of the bidirectional optical communication system, besides the sending submodule 10, a receiving submodule 40, which may be constituted of a receiving photodiode, or the like, is located within the sending-receiving module 30, which is capable of performing the bidirectional optical communication. The receiving submodule 40 is connected by a connector 31 to the transmitting PMMA plastic fiber 32. Specifically, this example of the bidirectional optical communication system is constituted of two sending-receiving modules 30, 30. Each of the two sending-receiving modules 30, 30 comprises the sending submodule 10 and the receiving submodule 40, which are connected with each other by one of two transmitting PMMA plastic fibers 32, 32 via the connectors 31, 31.

In the embodiment described above, the PMMA plastic fiber 12, which is of the same type as the transmitting PMMA plastic fiber 32, is located within the module and coupled with the semiconductor light emitting device. However, the transmission apparatus using a plastic fiber in accordance with the present invention is constituted so as to be capable of performing high-performance transmission by efficiently utilizing the low-propagation-loss characteristics of the PMMA plastic fiber, which is employed for the transmission. Therefore, the optical fiber, which is of the same type as the optical fiber employed for the transmission, need not necessarily be utilized within the module. Alternatively, an optical system, such as a glass optical fiber, a lens capable of being appropriately coupled with an external fiber, or an optical waveguide, may be utilized within the module.

Also, in the embodiment described above, the heating means and the temperature detecting means are located within the submodule. However, as for a certain apparatus utilizing the submodule, it may often be desirable that the heating means and the temperature detecting means are located on the side outward from the submodule. Further, such that the heating means and the temperature detecting means may be utilized also for the other purposes, or such that the temperatures of a plurality of submodules may be controlled simultaneously, the heating means and the temperature detecting means may be located at the exterior.

Furthermore, in the transmission apparatus using a plastic fiber in accordance with the present invention, besides the plastic fiber having the core constituted of only the PMMA, a plastic fiber having the core constituted of a PMMA added with a different substance may also be employed. In such cases, the propagation loss characteristics of the plastic fiber are represented by the pattern basically identical with the pattern illustrated in FIG. 6, though the values of the loss alter. Therefore, the same effects as those described above are capable of being obtained. The transmission apparatus using a plastic fiber in accordance with the present invention is also applicable to the cases wherein the plastic fiber has the core constituted of a material other than the PMMA and has the propagation-loss characteristics basically identical with the propagation-loss characteristics illustrated in FIG. 6.

Figure 7:
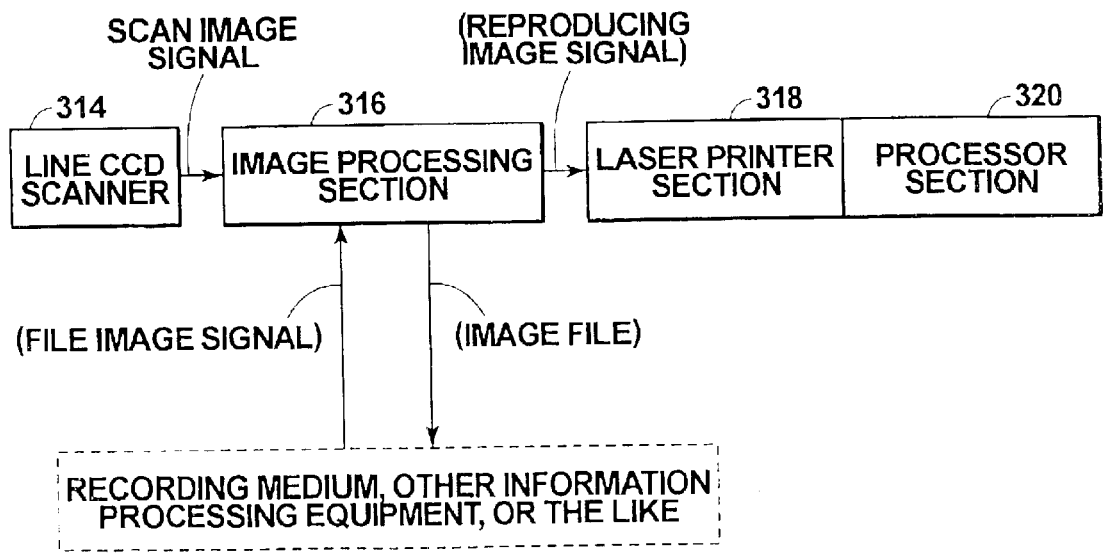
FIG. 7 is a block diagram showing a digital laboratory system, in which the transmission apparatus using a plastic fiber in accordance with the present invention may be employed.
Figure 8:
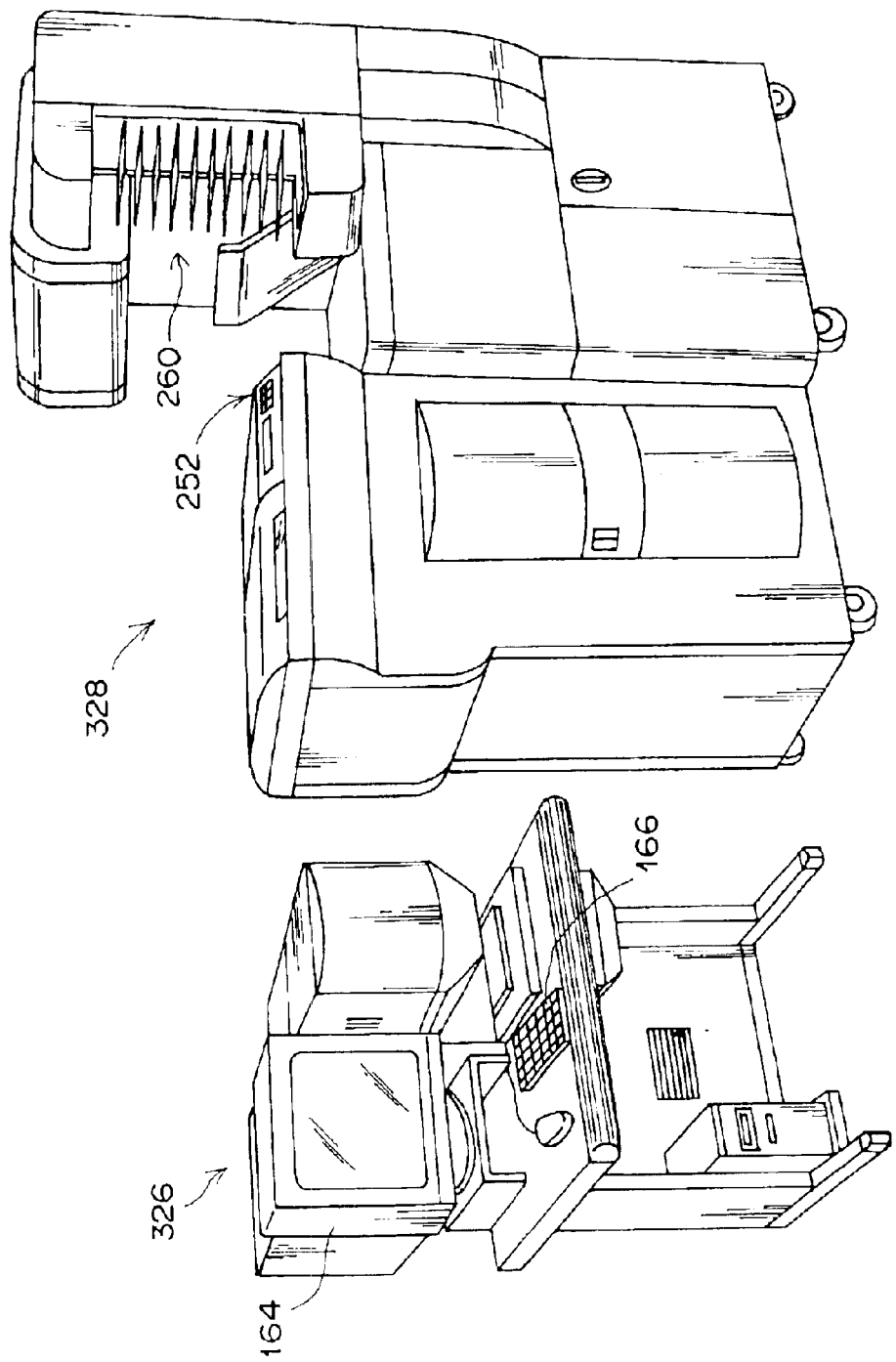
FIG. 8 is a perspective view showing the digital laboratory system of FIG. 7.

Further, besides the ordinary optical communication, the transmission apparatus using a plastic fiber in accordance with the present invention is applicable to every transmission system for transmitting information as a light signal. One example of the transmission system other than the transmission system for optical communication is a digital laboratory system. FIG. 7 is a block diagram showing a digital laboratory system 310, in which the transmission apparatus using a plastic fiber in accordance with the present invention may be employed. FIG. 8 is a perspective view showing the digital laboratory system 310 of FIG. 7. As illustrated in FIG. 7, the digital laboratory system 310 comprises a line CCD scanner 314, an image processing section 316, a laser printer section 318, and a processor section 320. The line CCD scanner 314 and the image processing section 316 are located in an input section 326 illustrated in FIG. 8. The laser printer section 318 and the processor section 320 are located in an output section 328 illustrated in FIG. 8.

The line CCD.scanner 314 reads out a film image, which has been recorded on photographic film, such as negative film or reversal film. By way of example, the line CCD scanner 314 is capable of reading out a film image having been recorded on photographic film, such as 135-size photographic film, 110-size photographic film, photographic film provided with a transparent magnetic layer (240-size photographic film: the so-called APS film), and 120-size and 220-size (Brownie size) photographic film. The line CCD scanner 314 reads out the film image described above with a line CCD image sensor and outputs an image signal representing the film image. Alternatively, in lieu of the line CCD scanner 314, an area CCD scanner for reading out the film image with an area CCD image sensor may be utilized.

The image processing section 316 receives the image signal (i.e., the scan image signal) from the line CCD scanner 314. The image processing section 316 is also capable of receiving an image signal, which has been obtained from an image recording operation performed with a digital camera, an image signal, which has been obtained from a scanner for reading out an image from an image storage sheet (e.g., a reflecting image storage sheet) other than photographic film, an image signal, which has been formed by a computer, and the like, from the exterior. (The group of the image signal, which has been obtained from the image recording operation performed with the digital camera, the image signal, which has been obtained from the scanner for reading out the image from the image storage sheet other than photographic film, the image signal, which has been formed by the computer, and the like, will hereinbelow be referred to as the file image signal.) By way of example, the file image signal is received from the exterior via a storage medium, such as a memory card, or is received from other information processing equipment via a communication line.

The image processing section 316 performs various kinds of image processing, such as image correction, on the received image signal and feeds out a processed image signal, which has been obtained from the image processing, as a reproducing image signal to the laser printer section 318. The image processing section 316 is also capable of feeding out the processed image signal, which has been obtained from the image processing, as an image file to the exterior (e.g., to a storage medium, such as a memory card, or to other information processing equipment via a communication line).

The laser printer section 318 is provided with a laser beam source capable of producing a red (R) laser beam, a green (G) laser beam, and a blue (B) laser beam. In the laser printer section 318, the laser beam is modulated in accordance with the reproducing image signal having been received from the image processing section 316, and the modulated laser beam is irradiated to photographic paper. In this manner, an image is reproduced on the photographic paper through a scanning exposure operation. Also, the processor section 320 performs treatment, such as color development, bleach-fix, washing, and drying, on the photographic paper, on which the image has been reproduced through the scanning exposure operation. In this manner, the image is formed on the photographic paper.

Figure 9:
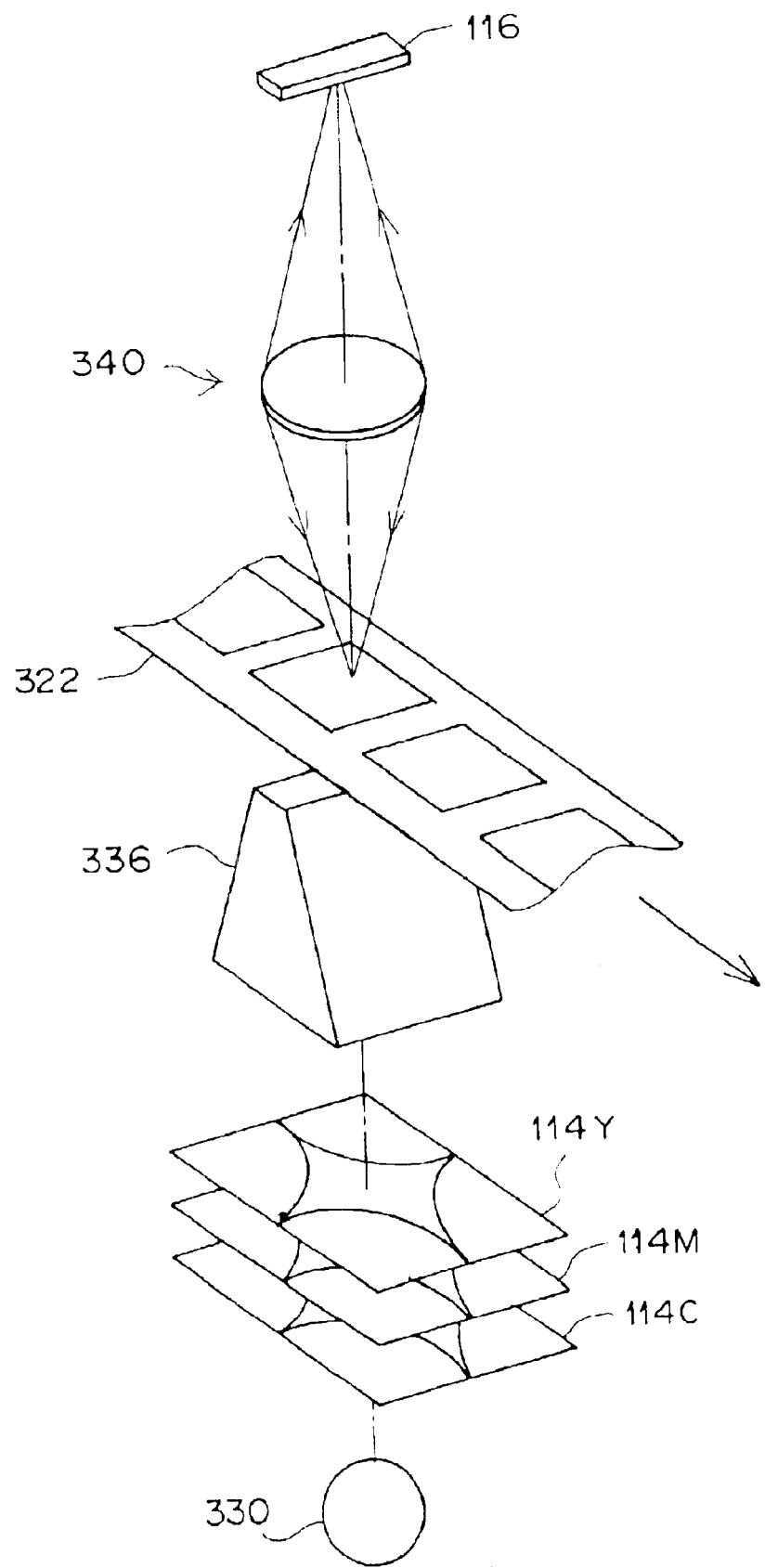
FIG. 9 is a schematic view showing an optical system of a line CCD scanner employed in the digital laboratory system.

How the line CCD scanner 314 is constituted will be described hereinbelow. FIG. 9 is a schematic view showing an optical system of the line CCD scanner 314. As illustrated in FIG. 9, the optical system of the line CCD scanner 314 comprises a light source 330 for producing light to be irradiated onto photographic film 322. The light source 330 may be constituted of a halogen lamp, a metal halide lamp, or the like. Also, a light diffusing box 336 for converting the light, which has been produced by the light source 330, into divergent light is located on the light radiating side of the light source 330.

The photographic film 322 is conveyed by a film carrier 338 (shown in FIG. 11, but not shown in FIG. 9), which is located on the light radiating side of the light diffusing box 336, in the direction normal to the optical axis of the light radiated out from the light diffusing box 336. In FIG. 9, the long photographic film 322 is shown. However, it is also possible to convey other kinds of photographic film, such as slide film (reversal film), which corresponds to one frame and is supported by a slide holder, and APS film. For each of the slide film and the APS film, an exclusive film carrier is prepared. (The film carrier for the APS film is provided with a magnetic head for reading out the information, which has been magnetically recorded on the magnetic layer of the APS film.)

Also, a cyan (C) light intensity adjusting filter 114C, a magenta (M) light intensity adjusting filter 114M, and a yellow (Y) light intensity adjusting filter 114Y are located between the light source 330 and the light diffusing box 336. The light intensity adjusting filter 114C, the light intensity adjusting filter 114M, and the light intensity adjusting filter 114Y are located in this order along the optical axis of the light radiated out from the light source 330. Further, a lens unit 340 and a line CCD image sensor 116 are located in this order along the optical axis and on the side of the photographic film 322, which side is opposite to the light source 330. The lens unit 340 forms an image of the light, which has passed through the film image, on the line CCD image sensor 116. In FIG. 9, as an aid in facilitating the explanation, a single lens is illustrated as the lens unit 340. However, actually, the lens unit 340 is constituted of a zoom lens comprising a plurality of lenses.

The line CCD image sensor 116 comprises sensing sections, which are located in three lines in parallel with one another and at a spacing from one another. Each of the sensing sections comprises a plurality of photoelectric conversion devices, which are constituted of CCD cells and located in a row. Also, each of the sensing sections is provided with an electronic shutter system. Further, each of R, G, and B color separation filters is fitted to the light entry side of one of the three sensing sections. (The line CCD image sensor 116 is thus constituted of the so-called three-line color CCD image sensor.) The line CCD image sensor 116 is located such that the position of the light receiving surface of each of the sensing sections coincides with the position, at which the image of the light is formed by the lens unit 340. Furthermore, each of transfer sections, which respectively correspond to the sensing sections, is located in the vicinity of the corresponding sensing section. Electric charges, which have been accumulated in the CCD cells of each of the sensing sections, are transferred successively via the corresponding transfer section. Also, though not shown, a shutter is located between the line CCD image sensor 116 and the lens unit 340.

Figure 10:
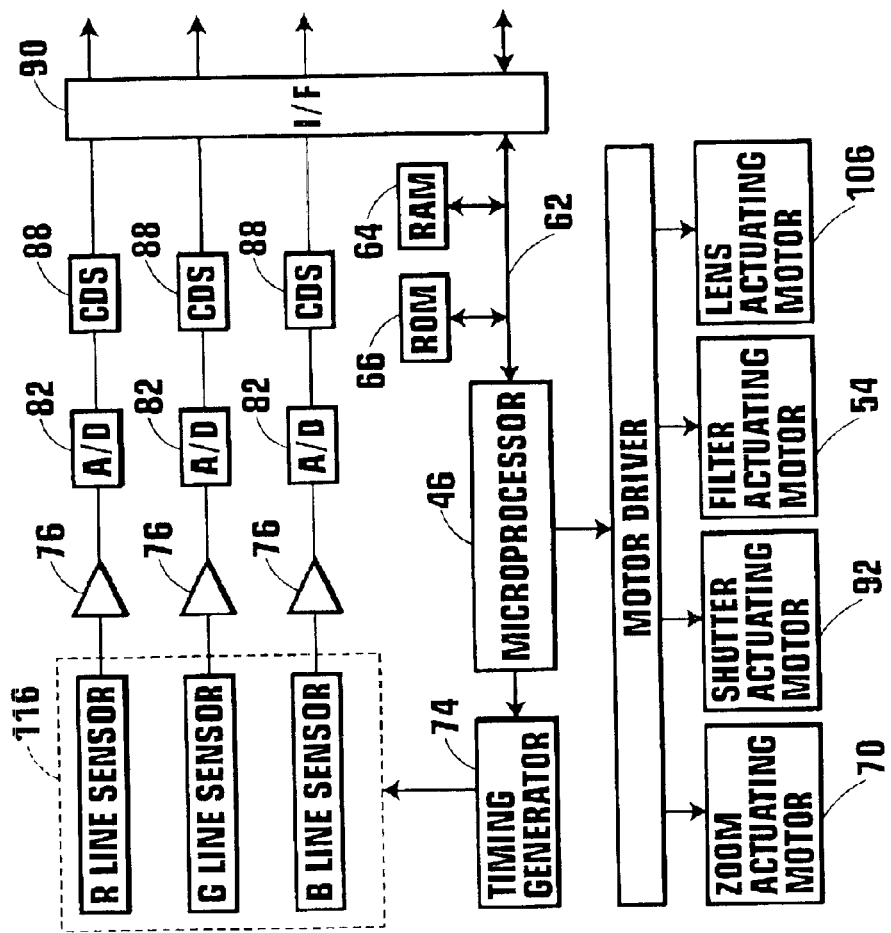
FIG. 10 is a block diagram showing an electric system of the line CCD scanner.

FIG. 10 is a block diagram showing an electric system of the line CCD scanner 314. As illustrated in FIG. 10, the line CCD scanner 314 comprises a microprocessor 46 for controlling the entire line CCD scanner 314. The microprocessor 46 is connected by a bus 62 to a RAM 64 (e.g., a SRAM) and a ROM 66 (e.g., a ROM allowing rewriting of stored information). The microprocessor 46 is also connected to a motor driver 48. The motor driver 48 is connected to a filter actuating motor 54. The filter actuating motor 54 is capable of performing independent sliding movement of each of the light intensity adjusting filters 114C, 114M, and 114Y.

The microprocessor 46 turns on and off the light source 330 in accordance with the on-off operation of an electric power switch (not shown). Also, in cases where the operation (the photometric operation) of the line CCD image sensor 116 for reading out the film image is to be performed, the microprocessor 46 actuates the filter actuating motor 54 in order to perform the independent sliding movement of each of the light intensity adjusting filters 114C, 114M, and 114Y. In this manner, the intensity of the light impinging upon the line CCD image sensor 116 is adjusted with respect to each of the color components.

Also, the motor driver 48 is connected to a zoom actuating motor 70 for moving the positions of the plurality of the lenses constituting the lens unit 340 in order to alter the zoom magnification of the lens unit 340. Further, the motor driver 48 is connected to a lens actuating motor 106 for moving the entire lens unit 340 in order to move the position, at which the image of the light is formed by the lens unit 340, along the optical axis. The microprocessor 46 actuates the zoom actuating motor 70 in order to alter the zoom magnification of the lens unit 340 to a desired magnification in accordance with the size of the film image and in accordance with whether trimming is or is not to be performed.

The line CCD image sensor 116 is connected to a timing generator 74. The timing generator 74 generates various kinds of timing signals (clock signals) for operating the line CCD image sensor 116, analog-to-digital converters 82, 82, 82, which will be described below, and the like. A signal output end of the line CCD image sensor 116 is connected to the analog-to-digital converters 82, 82, 82 via amplifiers 76, 76, 76. Image signals, which have been fed out from the line CCD image sensor 116, are amplified by the amplifiers 76, 76, 76 and converted by the analog-to-digital converters 82, 82, 82 into digital image signals.

An output end of each of the analog-to-digital converters 82, 82, 82 is connected to an interface (I/F) circuit 90 via a corresponding one of correlative double sampling circuits (CDS circuits) 88, 88, 88. Each of the CDS circuits 88, 88, 88 samples feed-through data, which represents a level of a feed-through signal, and pixel data, which represents a level of a pixel signal. Also, each of the CDS circuits 88, 88, 88 subtracts the feed-through data from the pixel data. The subtraction is performed with respect to each of pixels. Further, each of the CDS circuits 88, 88, 88 successively feeds out the results of the subtraction (i.e., the pixel data accurately corresponding to the amounts of electric charges having been accumulated in the CCD cells) as the scan image signal via the I/F circuit 90 into the image processing section 316.

From the line CCD image sensor 116, the R, G, and B photometric signals are fed out in parallel. Therefore, three signal processing systems, each of which comprises the amplifier 76, the analog-to-digital converter 82, and the CDS circuit 88, are connected to the line CCD image sensor 116. Also, as the scan image signal, the R, G, and B image signals are fed out in parallel from the I/F circuit 90.

Further, the motor driver 48 is connected to a shutter actuating motor 92 for opening and closing the shutter. A dark output of the line CCD image sensor 116 is compensated for by the image processing section 316. The level of the dark output is capable of being detected with an operation, wherein the microprocessor 46 operates to close the shutter when the operation for reading out the film image is not being performed.

Figure 11:
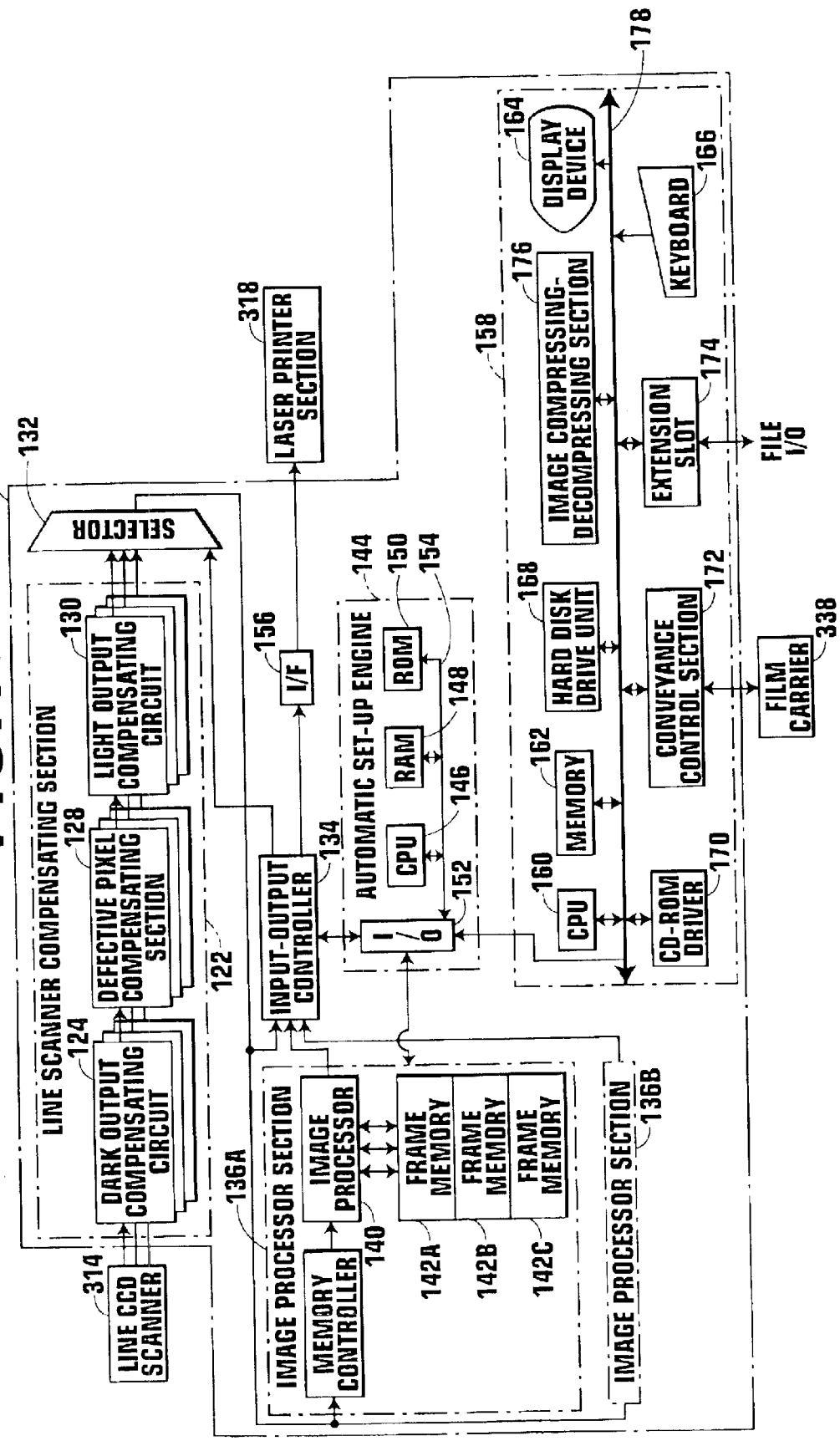
FIG. 11 is a block diagram showing an image processing section of the digital laboratory system.

How the image processing section 316 is constituted will be described hereinbelow with reference to FIG. 11. The image processing section 316 comprises a line scanner compensating section 122 corresponding to the line CCD scanner 314. The line scanner compensating section 122 comprises three signal processing systems corresponding to the R, G, and B image signals, which are fed out in parallel from the line CCD scanner 314. Each of the three signal processing systems comprises a dark output compensating circuit 124, a defective pixel compensating section 128, and a light output compensating circuit 130.

The dark output compensating circuit 124 stores a signal, which has been received from the line CCD scanner 314 when the light entry side of the line CCD image sensor 116 is being blocked from light by the shutter, (i.e., the signal representing the dark output level of each of the cells of each sensing section of the line CCD image sensor 116) with respect to each of the cells. Also, the dark output compensating circuit 124 subtracts the dark output level of each cell, which corresponds to one of the pixels, from the value of the corresponding pixel in the image, which is represented by the scan image signal having been received from the line CCD scanner 314. In this manner, the dark output compensating circuit 124 compensates for the dark output.

Also, due to a variation of the photoelectric conversion characteristics of the line CCD image sensor 116, a variation may occur in image density in units of the cell. In the light output compensating circuit 130 located at the stage after the defective pixel compensating section 128, a gain is determined previously with respect to each of the cells and in accordance with an image signal, which represents a film image for adjustment and has been received from the line CCD scanner 314. The image signal, which represents the film image for adjustment, is obtained from an operation, wherein the film image for adjustment is read out by the line CCD image sensor 116 when the film image for adjustment, which has a predetermined image density over the entire image area, is being set at the line CCD scanner 314. (A variation in image density among the pixels represented by the image signal, which represents the film image for adjustment, occurs due to the variation of the photoelectric conversion characteristics among the cells of the line CCD image sensor 116.) Also, the light output compensating circuit 130 performs the compensation of each of the pixel values represented by the image signal, which represents the film image to be read out and has been received from the line CCD scanner 314, in accordance with the gain having been determined for each of the cells.

In cases where the image density of a certain pixel, which is among the pixels represented by the image signal representing the film image for adjustment, is markedly different from the image density of the other pixels, it may be regarded that a failure has occurred in the cell of the line CCD image sensor 116, which cell corresponds to the certain pixel described above, and that the certain pixel described above is a defective pixel. The defective pixel compensating section 128 stores an address of the defective pixel in accordance with the image signal representing the film image for adjustment. Also, as for the image signal component of the image signal representing the film image to be read out and having been received from the line CCD scanner 314, which image signal component represents the defective pixel, the defective pixel compensating section 128 forms a new image signal component with an operation for interpolation from the image signal components representing the pixels surrounding the defective pixel.

Further, the line CCD image sensor 116 comprises the three lines (i.e., the three CCD cell rows), which extend in the direction normal to the direction of conveyance of the photographic film 322 and are located so as to stand side by side at a predetermined spacing with respect to the direction of conveyance of the photographic film 322. Therefore, time differences occur among the timings, with which the operations for outputting the image signal components of the R, G, and B color components from the line CCD scanner 314 are started. The line scanner compensating section 122 is provided with a delay circuit (not shown). The delay circuit performs an operation for delaying the image signal output timings. Specifically, in the delay circuit, the output timing of the image signal component of one color component, which image signal component is outputted latest among the image signal components of the R, G, and B color components, is taken as a reference output timing, and different delay times are set for the image signal components of the other two color components, such that the image signal components of the R, G, and B color components, which image signal components represent an identical pixel in the film image, are outputted simultaneously from the line scanner compensating section 122.

The output end of the line scanner compensating section 122 is connected to an input end of a selector 132. The image signal, which has been outputted from the line scanner compensating section 122, is fed into the selector 132. The input end of the selector 132 is also connected to a signal output end of an input-output controller 134. The file image signal, which has been inputted from the exterior, is fed from the input-output controller 134 into the selector 132. An output end of the selector 132 is connected to signal input ends of the input-output controller 134, an image processor section 136A, and an image processor section 136B. The selector 132 is capable of outputting the received image signal selectively to each of the input-output controller 134, the image processor section 136A, and the image processor section 136B.

The image processor section 136A comprises a memory controller 138, an image processor 140, a frame memory 142A, a frame memory 142B, and a frame memory 142C. Each of the frame memory 142A, the frame memory 142B, and the frame memory 142C has a capacity for storing the image signal, which represent one frame of the film image. The image signal, which has been received from the selector 132, is stored in one of the frame memory 142A, the frame memory 142B, and the frame memory 142C. The memory controller 138 controls the addresses of the image signal components of the received image signal, which image signal components are to be stored in the frame memory 142A, the frame memory 142B, or the frame memory 142C, such that the image signal components are stored in a predetermined order in the storage region of the frame memory.

The image processor 140 fetches the image signal, which has been stored in the frame memory 142A, the frame memory 142B, or the frame memory 142C. Also, the image processor 140 performs various kinds of image processing on the image signal. The image processing includes, for example, gradation transform, color transform, hyper-tone processing for compressing the gradation of super-low frequency luminance components of the image, and hyper-sharpness processing for suppressing graininess and enhancing sharpness. Processing conditions for the image processing are calculated automatically by an automatic set-up engine 144, which will be described later. The image processing is performed under the thus calculated processing conditions. The image processor 140 is connected to the input-output controller 134. A processed image signal, which has been obtained from the image processing, is temporarily stored in the frame memory 142A, the frame memory 142B, or the frame memory 142C, and is then fed out with a predetermined timing into the input-output controller 134. The image processor section 136B has the same constitution as the constitution of the image processor section 136A described above.

The line CCD scanner 314 is also capable of performing two image read-out operations with different resolutions. In a first image read-out operation with a comparatively low resolution (hereinbelow referred to as the pre-scanning operation), the operation for reading out the film image is performed under image read-out conditions (such as the intensity of the light of each of the R, G, and B wavelength regions irradiated to the photographic film, and the time for which the electric charges are accumulated in the CCD image sensor), which have been adjusted such that saturation of the accumulated electric charges does not occur in the line CCD image sensor 116 in cases where, for example, the image density of the film image is markedly low (e.g., in cases where the film image is an over-exposure negative image recorded on negative film). The image signal (i.e., a pre-scan image signal) having been obtained from the pre-scanning operation is fed from the selector 132 into the input-output controller 134. The pre-scan image signal is then fed from the input-output controller 134 into the automatic set-up engine 144.

The automatic set-up engine 144 comprises a CPU 146, a RAM 148 (e.g., a DRAM), a ROM 150 (e.g., a ROM allowing rewriting of stored information), and an input-output port 152, which are connected to one another by a bus 154.

The automatic set-up engine 144 adjusts the intensity of the light, which is produced by the light source 330 during a second image read-out operation with a comparatively high resolution (hereinbelow referred to as the fine scanning operation) performed by the line CCD scanner 314, in accordance with the pre-scan image signals, which represent a plurality of frames of the film images and have been received from the input-output controller 134. Also, the automatic set-up engine 144 calculates the image processing conditions for the image signal having been obtained from the fine scanning operation and feeds the information, which represents the calculated image processing conditions, into the image processor 140 of the image processor section 136A. The image processing conditions are calculated in the manner described below. Specifically, in accordance with the exposure quantity at the time of the image recording, the kind of the light source at the time of the image recording, and other feature measures, a judgment is made as to whether there are or are not a plurality of film images of approximately identical scenes. In cases where it has been judged that there are a plurality of film images of approximately identical scenes, the image processing conditions for the fine scan image signals representing the plurality of the film images are set to be identical with one another or approximately identical with one another.

The optimum image processing conditions vary in accordance with, for example, whether the processed image signal is to be utilized in the laser printer section 318 for the reproduction of the image on the photographic paper or is to be fed out to the exterior. Therefore, the image processing section 316 is provided with the image processor section 136A and the image processor section 136B. For example, in cases where the processed image signal is to be utilized in the laser printer section 318 for the reproduction of the image on the photographic paper and is to be fed out to the exterior, the automatic set-up engine 144 calculates the image processing conditions, which are optimum for the reproduction of the image on the photographic paper, and the image processing conditions, which are optimum for the feeding-out to the exterior. The information representing the calculated image processing conditions, which are optimum for the reproduction of the image on the photographic paper, and the information representing the calculated image processing conditions, which are optimum for the feeding-out to the exterior, are fed out respectively into the image processor section 136A and the image processor section 136B. Therefore, in the image processor section 136A and the image processor section 136B, the image processing operations on the identical fine scan image signal are capable of being performed under different image processing conditions.

Also, in accordance with the pre-scan image signal, which represents the film image and has been received from the input-output controller 134, the automatic set-up engine 144 calculates an image reproducing parameter, which defines gray balance, or the like, at the time of the reproduction of the image on the photographic paper performed by the laser printer section 318. The automatic set-up engine 144 feeds out the information, which represents the calculated image reproducing parameter, into the laser printer section 318 at the same time as when the reproducing image signal, which will be described later, is fed out into the laser printer section 318. Further, as for the file image signal inputted from the exterior, the automatic set-up engine 144 calculates the image processing conditions in the same manner as that described above.

The input-output controller 134 is connected via an I/F circuit 156 to the laser printer section 318. In cases where the processed image signal is to be utilized in the laser printer section 318 for the reproduction of the image on the photographic paper, the processed image signal, which has been obtained from the image processing performed by the image processor section 136A, is fed as the reproducing image signal from the input-output controller 134 via the I/F circuit 156 into the laser printer section 318. Also, the automatic set-up engine 144 is connected to a personal computer 158. In cases where the processed image signal is to be fed out as the image file to the exterior, the processed image signal, which has been obtained from the image processing performed by the image processor section 136B, is fed from the input-output controller 134 via the automatic set-up engine 144 into the personal computer 158.

The personal computer 158 comprises a CPU 160, a memory 162, a display device 164 (also shown in FIG. 8), a keyboard 166 (also shown in FIG. 8), a hard disk drive unit 168, a CD-ROM driver 170, a conveyance control section 172, an extension slot 174, and an image compressing-decompressing section 176, which are connected to one another by a bus 178. The conveyance control section 172 is connected to the film carrier 338 in order to control the conveyance of the photographic film 322 performed by the film carrier 338. Also, in cases where the APS film has been set on the film carrier 338, the information (such as information representing the image recording size, or the like), which has been read by the film carrier 338 from the magnetic layer of the APS film, is fed from the film carrier 338 into the conveyance control section 172.

Also, the personal computer 158 is connected via the extension slot 174 to a driver (not shown) for performing data reading and writing with respect to a storage medium, such as a memory card, and a communication control device for performing communication with other information processing equipment. In cases where the processed image signal, which is to be fed out to the exterior, is inputted from the input-output controller 134, the processed image signal is fed out as the image file via the extension slot 174 to the exterior (the aforesaid driver for performing the data reading and writing with respect to the storage medium, the aforesaid communication control device, or the like). Also, in cases where a file image signal has been inputted via the extension slot 174 from the exterior, the inputted file image signal is fed out via the automatic set-up engine 144 into the input-output controller 134. In such cases, the input-output controller 134 feeds the received file image signal into the selector 132.

The image processing section 316 is capable of operating in the manner described below. Specifically, the pre-scan image signal, or the like, is fed into the personal computer 158. Also, the film image, which has been read out by the line CCD scanner 314, is reproduced and displayed on the display device 164. Alternatively, the image, which will be reproduced on the photographic paper, is presumed and displayed on the display device 164. In cases where an instruction for image correction, or the like, is given by the operator from the keyboard 166, the image correction is reflected upon the adjustment of the image processing conditions.

FIG. 12 is a block diagram showing electric systems of the laser printer section 318 and the processor section 320. The laser printer section 318 comprises a frame memory 230 for storing the image signal. The frame memory 230 is connected via an I/F circuit 232 to the image processing section 316. The reproducing image signal having been inputted from the image processing section 316 (i.e., the image signal made up of image signal components representing R, G, and B image densities of respective pixels in the image to be reproduced on the photographic paper) is fed via the I/F circuit 232 into the frame memory 230 and stored in the frame memory 230. The frame memory 230 is connected via a digital-to-analog converter 234 to an exposure section 236. The frame memory 230 is also connected to a printer section control circuit 238.

The transmission apparatus using a plastic fiber in accordance with the present invention is capable of being utilized appropriately at every part of information transmission in the digital laboratory system described above. Particularly, the transmission apparatus using a plastic fiber in accordance with the present invention is capable of being employed appropriately to transmit light signals for the following: signal transfer from the line CCD scanner 314 to the image processing section 316 (between the amplifiers 76, 76, 76 and the analog-to-digital converter 82, 82, 82, between the analog-to-digital converters 82, 82, 82 and the CDS circuits 88, 88, 88, and between the CDS circuits 88, 88, 88 and the I/F circuit 90, as illustrated in FIG. 10); signal transfer from the image processing section 316 to the laser printer section 318 (between the digital-to-analog converter 234 and the exposure section 236, and between the frame memory 230 and the digital-to-analog converter 234, as illustrated in FIG. 12); signal transfer from the image processing section 316 to the main control unit (i.e., the personal computer 158) (between the input-output port 152 and the bus 178, as illustrated in FIG. 11); signal transfer from the main control unit (i.e., the personal computer 158) to the external device (between the image processing section 316 and the recording medium, other information processing equipment, or the like, as illustrated in FIG. 7); and signal transfer from the input device to the output device (between the image processing section 316 and the laser printer section 318, as illustrated in FIG. 11).

The transmission apparatus using a plastic fiber in accordance with the present invention is also capable of being employed appropriately for the information transmission among an input stage, an editing (DTP) stage, and an output stage in a printing plate making process. The transmission apparatus using a plastic fiber in accordance with the present invention is further capable of being employed appropriately for the information transmission in the medical fields (e.g., information transmission in an intra-hospital LAN and an inter-hospital LAN, specifically, the information transmission between a central server, in which information concerning patient's charts and image signals representing medical diagnosis images have been accumulated, and terminals located in consultation rooms).

What is claimed is:

1. A transmission apparatus comprising:

i) a graded index plastic fiber, which is provided with a core containing a polymethyl methacrylate as a principal constituent, and ii) a semiconductor light emitting device, which produces light to be propagated through the plastic fiber, wherein the semiconductor light emitting device is a device, which produces light having wavelengths falling within the range of 630 nm to 680 nm, and the transmission apparatus further comprises a temperature adjusting system, which comprises:
  a) heating means for heating the semiconductor light emitting device,
  b) temperature detecting means for detecting the temperature of the semiconductor light emitting device and feeding out a temperature detection signal, which represents the temperature of the semiconductor light emitting device, and
  c) a control circuit for controlling actuation of the heating means in accordance with the temperature detection signal, which is received from the temperature detecting means, in order to set the temperature of the semiconductor light emitting device at a predetermined target value that is lower than the highest temperature assumed to occur under an environment, in which the semiconductor light emitting device is located.

2. An apparatus as defined in claim 1 wherein the light produced by the semiconductor light emitting device has wavelengths falling within the range of 640 nm to 660 nm.

3. An apparatus as defined in claim 2 wherein the semiconductor light emitting device comprises an end face emission type of semiconductor laser.

4. An apparatus as defined in claim 2 wherein the semiconductor light emitting device comprises a surface emission type of semiconductor laser or a surface emission type of light emitting diode.

5. An apparatus as defined in claim 2 wherein the heating means comprises an electric heater, and the control circuit controls an actuating current for the electric heater.

6. An apparatus as defined in claim 2 wherein the temperature detecting means comprises a thermistor.

7. An apparatus as defined in claim 1 wherein the semiconductor light emitting device comprises an end face emission type of semiconductor laser.

8. An apparatus as defined in claim 1 wherein the semiconductor light emitting device comprises a surface emission type of semiconductor laser or a surface emission type of light emitting diode.

9. An apparatus as defined in claim 1 wherein the heating means comprises an electric heater, and the control circuit controls an actuating current for the electric heater.

10. An apparatus as defined in claim 1 wherein the temperature detecting means comprises a thermistor.

11. An apparatus as defined in claim 1, wherein the temperature adjusting system allows the temperature of the semiconductor light emitting device to fluctuate in accordance with an ambient temperature of the environment in which the semiconductor light emitting device is located if the ambient temperature is greater than the predetermined target value.

12. An apparatus as defined in claim 1, wherein the control circuit controls actuation of the heating means only if an ambient temperature of the environment in which the semiconductor light emitting device is located is less than the predetermined target value so that the temperature of the semiconductor light emitting device is allowed to fluctuate in accordance with the ambient temperature when the ambient temperature is greater than the predetermined target value.

13. A transmission apparatus comprising:
a plastic fiber comprising a core containing a polymethyl methacrylate as a principal constituent;
a semiconductor light emitting device which produces light to be propagated through the plastic fiber, wherein the semiconductor light emitting device emits light having wavelengths falling within the range of 630 nm to 680 nm; and
a temperature adjusting system which comprises:
  heating means for heating the semiconductor light emitting device,
  temperature detecting means for detecting a temperature of the semiconductor light emitting device and generating a temperature detection signal which represents the temperature of the semiconductor light emitting device, and
  a control circuit for controlling actuation of the heating means in accordance with the temperature detection signal, which is received from the temperature detecting means, in order to set the temperature of the semiconductor light emitting device at a predetermined target value that is lower than a highest temperature assumed to occur in an environment in which the semiconductor light emitting device is located,
wherein the control circuit sets the temperature of the semiconductor light emitting device at +35° C. in cases where the temperature of the environment, in which the semiconductor light emitting device is located, takes a value falling within the range of −45° C. to +85° C.

14. A transmission apparatus comprising:
a plastic fiber comprising a core containing a polymethyl methacrylate as a principal constituent;
a semiconductor light emitting device which produces light to be propagated through the plastic fiber, wherein the semiconductor light emitting device emits light having wavelengths falling within the range of 640 nm to 660 nm; and
a temperature adjusting system which comprises:
  heating means for heating the semiconductor light emitting device,
  temperature detecting means for detecting a temperature of the semiconductor light emitting device and generating a temperature detection signal which represents the temperature of the semiconductor light emitting device, and
  a control circuit for controlling actuation of the heating means in accordance with the temperature detection signal, which is received from the temperature detecting means, in order to set the temperature of the semiconductor light emitting device at a predetermined target value that is lower than a highest temperature assumed to occur in an environment in which the semiconductor light emitting device is located,
wherein the control circuit sets the temperature of the semiconductor light emitting device at +35° C. in cases where the temperature of the environment, in which the semiconductor light emitting device is located, takes a value falling within the range of −45° C. to +85° C.

15. A transmission apparatus comprising:
a graded index plastic fiber comprising a core containing a polymethyl methacrylate;
a semiconductor light emitting device which emits light to be propagated through the plastic fiber; and
a temperature adjusting system for maintaining a temperature of the semiconductor light emitting device at a predetermined temperature if an ambient temperature of an environment in which the semiconductor light emitting device is located is less than the predetermined temperature, and allowing the temperature of the semiconductor light emitting device to fluctuate in accor dance with the ambient temperature if the ambient temperature is greater than the predetermined temperature.

16. The transmission apparatus as defined in claim 15, wherein the predetermined temperature is lower than a highest ambient temperature in the environment in which the semiconductor light emitting device is located.

17. The transmission apparatus as defined in claim 15, wherein the temperature adjusting system comprises:
   a heater for heating the semiconductor light emitting device;
   a temperature detector for detecting the temperature of the semiconductor light emitting device and generating a temperature detection signal indicating the temperature of the semiconductor light emitting device; and
   a control circuit for controlling the heater in accordance with the temperature detection signal received from the temperature detector to maintain the temperature of the semiconductor light emitting at the predetermined temperature if the ambient temperature is less than the predetermined temperature.

18. The transmission apparatus as defined in claim 17, wherein the predetermined temperature is +35° C. and the control circuit controls the heater to maintain the tempera ture of the semiconductor light emitting device at +35° C. if the ambient temperature is within a range of 45° C. to +35° C.

19. A transmission apparatus comprising:
   a plastic fiber comprising a core containing a polymethyl methacrylate;
   a semiconductor light emitting device which emits light to be propagated through the plastic fiber; and
   a temperature adjusting system for maintaining a temperature of the semiconductor light emitting device at a predetermined temperature if an ambient temperature of an environment in which the semiconductor light emitting device is located is less than the predetermined temperature, and allowing the temperature of the semiconductor light emitting device to fluctuate in accordance with the ambient temperature if the ambient temperature is greater than the predetermined temperature, wherein the predetermined temperature is +35° C. and the temperature adjusting system maintains the temperature of the semiconductor light emitting device at +35° C. if the ambient temperature is within a range of −45° C. to +35° C.

* * * * *